United States Patent
Park et al.

(10) Patent No.: US 10,811,117 B2
(45) Date of Patent: Oct. 20, 2020

(54) METHOD FOR SRAM YIELD ESTIMATION

(71) Applicant: Korea University Research and Business Foundation, Seoul (KR)

(72) Inventors: Jongsun Park, Seoul (KR); Woong Choi, Bucheon-Si (KR)

(73) Assignee: Korea University Research and Business Foundation, Seoul (KR)

( * ) Notice: Subject to any disclaimer, the term of this patent is extended or adjusted under 35 U.S.C. 154(b) by 443 days.

(21) Appl. No.: 15/821,134

(22) Filed: Nov. 22, 2017

(65) Prior Publication Data
US 2018/0247698 A1 Aug. 30, 2018

(30) Foreign Application Priority Data

Feb. 28, 2017 (KR) .................. 10-2017-0025989

(51) Int. Cl.
| | | |
|---|---|---|
| *G11C 29/50* | (2006.01) | |
| *G11C 11/418* | (2006.01) | |
| *G11C 11/419* | (2006.01) | |
| *G11C 29/52* | (2006.01) | |
| *G06F 30/367* | (2020.01) | |

(52) U.S. Cl.
CPC ............ *G11C 29/50* (2013.01); *G06F 30/367* (2020.01); *G11C 11/418* (2013.01); *G11C 11/419* (2013.01); *G11C 29/52* (2013.01); *G11C 2029/5002* (2013.01)

(58) Field of Classification Search
CPC ....... G11C 29/50; G11C 29/52; G11C 11/418; G11C 11/419; G11C 2029/5002; G06F 30/367
See application file for complete search history.

(56) References Cited

U.S. PATENT DOCUMENTS

| | | | | |
|---|---|---|---|---|
| 2010/0153086 A1* | 6/2010 | Satoh | ............... | G06F 30/367 703/14 |
| 2016/0284421 A1* | 9/2016 | Joshi | ............... | G11C 29/04 |

FOREIGN PATENT DOCUMENTS

| | | |
|---|---|---|
| KR | 101385109 B1 | 4/2014 |
| KR | 20140112135 A | 9/2014 |

OTHER PUBLICATIONS

Choi el al., "Improved Perturbation Vector Generation Method for Accurate SRAM Yield Estimation"., IEEE Transactions on Computer-Aided Design of Integrated Circuits and Systems, vol. 36, No. 9, Sept. 2017. p. 1511-1521.*

(Continued)

*Primary Examiner* — Eunhee Kim
(74) *Attorney, Agent, or Firm* — Fox Rothschild LLP (57) ABSTRACT

A method for SRAM yield estimation includes: generating a first perturbation vector depending on a DC voltage input condition for an assist operation section of a SRAM which is an estimation target; calculating a first margin on the basis of the first perturbation vector; performing an AC simulation during the assist operation section depending on the DC voltage input condition; generating a second perturbation vector depending on a DC voltage input condition for a normal operation section which is set when the AC simulation is ended; calculating a second margin on the basis of the second perturbation vector; and selecting a minimum margin from among the first margin and the second margin and estimating a yield of the SRAM on the basis of the selected margin.

5 Claims, 6 Drawing Sheets

(56) References Cited

OTHER PUBLICATIONS

Leiva., "Methods for Generating Perturbation Vectors for Topography Optimization of Structures"., 5th World Congress of Structural and Multidisciplinary., 2003. 6 Pages.*
Wong. "Direct SRAM Operation Margin Computation with Random Skews of Device Characteristics"., in Extreme Statistics in Nanoscale Memory Design, A. Singhee and R. A. Rutenbar, Eds. New York, NY,USA: Springer, 2010, pp. 97-136.*
Wann et al., "SRAM Cell Design for Stability Methodology," IEEE VLSI-TSA International Symposium (Aug. 22, 2005); pp. 21-22.

\* cited by examiner

METHOD FOR SRAM YIELD ESTIMATION

CROSS-REFERENCE TO RELATED APPLICATION

This application claims the benefit under 35 USC 119(a) of Korean Patent Application No. 10-2017-0025989 filed on Feb. 28, 2017, in the Korean Intellectual Property Office, the entire disclosures of which are incorporated herein by reference for all purposes.

TECHNICAL FIELD

The present disclosure relates to a method for SRAM yield estimation.

BACKGROUND

In a technology for manufacturing memory devices which are key components in computers and the like, it is necessary to secure a uniform yield regardless of external process variables in order to improve the productivity thereof. To this end, in the case where a new design is suggested, there is a demand for a method for estimating a yield which can be secured in the design, and studies thereon are being actively conducted. Particularly, in a process of manufacturing memories, it is necessary to exactly estimate a yield in consideration of change in process variables.

Conventionally, it has been known to employ a Montecarlo simulation for estimating a yield of, for example, a static random-access memory (SRAM). However, a large number of times of sampling has been required to improve a yield estimation rate, and, thus, the time required for a yield estimation simulation has been sharply increased.

To overcome this problem, a method for directly calculating a SRAM operation margin has recently been developed. That is, a method for estimating a yield using N-curve metric and a perturbation vector has been applied to an access disturb margin indicative of the read stability of the SRAM and a write margin indicative of the write stability of the SRAM. As for the SRAM, the read performance and the write performance are measured for evaluating its performance and a test may be performed on the basis of whether or not the measured values are in the minimum range required for operation of the SRAM.

The conventional method is based on linear approximation. However, the SRAM actually has non-linear N-curve metric characteristics depending on an operation voltage, which needs to be improved. Further, as for the SRAM in a low-voltage driving environment, assist operations are performed sequentially to improve the performance thereof, which is a technology for widening an operation margin by reducing potentials of a bit line and a word line during a write operation and a read operation of the SRAM. In this case, it is necessary to modify a perturbation vector depending on the voltage applied thereto.

SUMMARY

In view of the foregoing, the present disclosure provides a method for SRAM yield estimation which is newly improved by reflecting non-linear characteristics of a target metric generated during a yield estimation process and conditions for assist operations in a SRAM.

However, problems to be solved by the present disclosure are not limited to the above-described problems. There may be other problems to be solved by the present disclosure.

According to a first aspect of the present disclosure, a method for SRAM yield estimation includes: generating a first perturbation vector depending on a DC voltage input condition for an assist operation section of a SRAM which is an estimation target; calculating a first margin on the basis of the first perturbation vector; performing an AC simulation during the assist operation section depending on the DC voltage input condition; generating a second perturbation vector depending on a DC voltage input condition for a normal operation section which is set when the AC simulation is ended; calculating a second margin on the basis of the second perturbation vector; and selecting a minimum margin from among the first margin and the second margin and estimating a yield of the SRAM on the basis of the selected margin.

According to a second aspect of the present disclosure, a method for SRAM yield estimation includes: dividing a maximum current or minimum current derived on the basis of N-curve metric into predetermined sections according to piecewise-linear approximation and calculating a perturbation vector for each section; calculating an access disturb margin or write margin on the basis of the perturbation vector; and estimating a yield of the SRAM on the basis of the access disturb margin or write margin.

According to the configuration of the present disclosure, during a process of generating a perturbation vector, it is possible to minimize an error caused by non-linear characteristics of a maximum current or minimum current in a low-voltage environment, and, thus, it is possible to more accurately estimate a yield. Further, yield estimation is performed in consideration of an assist operation of a SRAM, and, thus, it is possible to more accurately estimate a yield.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Hereinafter, embodiments of the present disclosure will be described in detail with reference to the accompanying drawings so that the present disclosure may be readily implemented by those skilled in the art. However, it is to be noted that the present disclosure is not limited to the embodiments but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element. Further, it is to be understood that the term "comprises or includes" and/or "comprising or including" used in the document means that one or more other components, steps, operation and/or existence or addition of elements are not excluded in addition to the described components, steps, operation and/or elements unless context dictates otherwise.

Figure 1A:
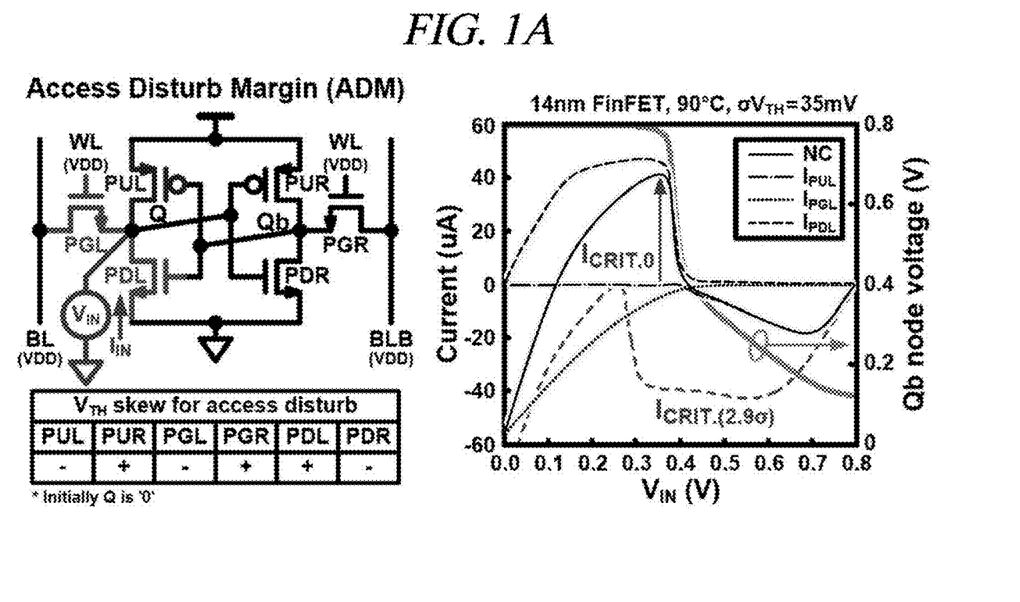
FIG. 1A and FIG. 1B illustrate a method for determining an access disturb margin and a write margin according to the conventional N-curve metric.
Figure 1B:
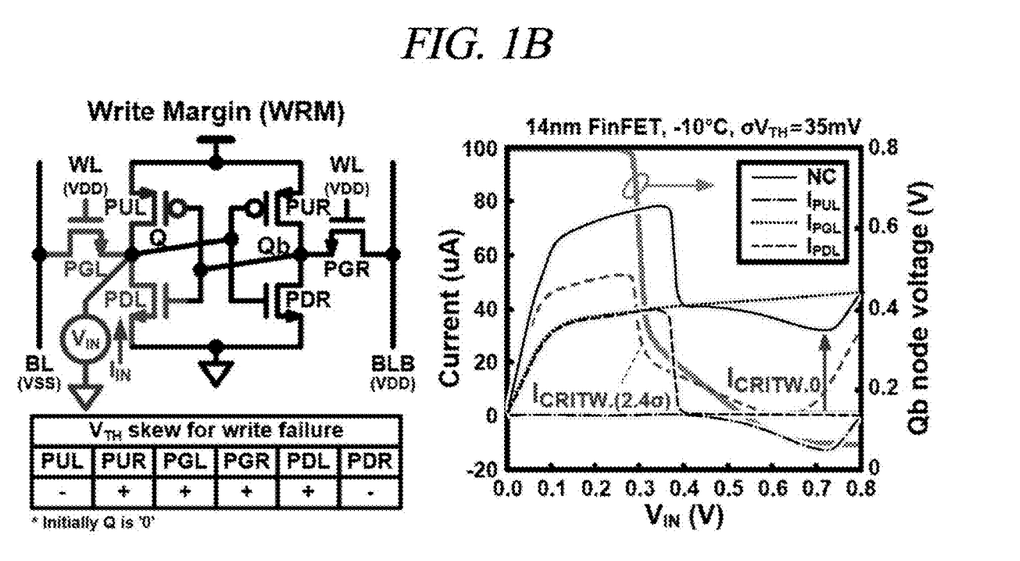

FIG. 1A and FIG. 1B illustrate a method for determining an access disturb margin and a write margin according to the conventional N-curve metric.

On the left of FIG. 1A and FIG. 1B, a unit memory cell structure of a general SRAM is illustrated. In the unit memory cell structure, a total of six (6) transistors PUL, PGL, PDL, PUR, PGR, and PDR are connected. On the right of FIG. 1A and FIG. 1B, a current condition of each transistor depending on an input voltage is illustrated.

For example, to verify an access disturb margin, each of a word line and a bit line is biased to VDD and to verify a write margin, the word line is biased to VDD and a first bit line BL and a second bit line BLB are biased to VSS and VDD, respectively.

When an input voltage Vin is changed from VSS to VDD, the sum of currents IPUL, IPDL, and IPGL generated from multiple transistors is displayed in the form of a N-curve In this case, a maximum current $I_{CRIT}$ shown in FIG. 1A refers to a maximum current in the N-curve while the input voltage Vin is changed from VSS to 0.5 VDD and becomes an index of an access disturb margin. Further, a minimum current $I_{CRITW}$ shown in FIG. 1B refers to a minimum current in the N-curve while the input voltage Vin is changed from 0.5 VDD to VDD and becomes an index of a write margin.

Figure 2:
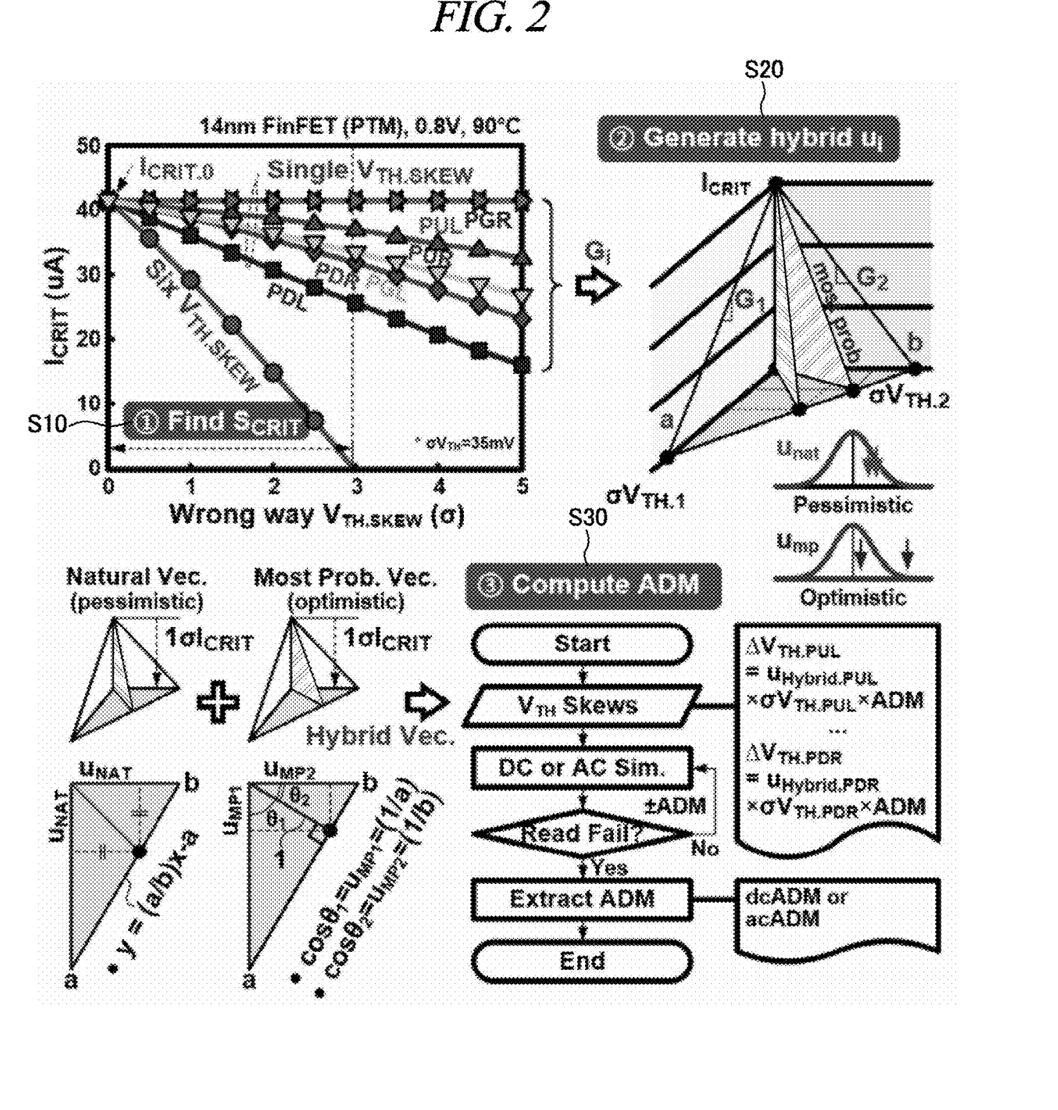
FIG. 2 illustrates a conventional method for yield estimation using an access disturb margin and a write margin.

FIG. 2 illustrates a conventional method for yield estimation using an access disturb margin and a write margin.

Firstly, a standard deviation of the maximum current and the minimum current may be represented according to the following equation.

$$\delta M = \sum_{i=1}^{m} G_i \delta x_i = 1\sigma M = \sqrt{\sum_{i=1}^{m} G_i^2 \sigma_i^2} \qquad [\text{Equation 1}]$$

Herein, M represents a target metric of interest and $G_i = |\partial M/\partial x_i|$ represents an absolute value of a gradient value of M for m-dimensional variable x. In this case, x is a value that induces a change in M.

For example, assuming that the maximum current $I_{CRIT}$ is a target metric of interest, a change in threshold voltage VTH of six (6) transistors included in each memory cell may be a random variable x. If data initially stored in a memory cell is "0", a skew direction for a threshold voltage at which a read operation failure occurs, which is as shown in the drawing. Herein, a specific standard deviation value σ (sigma) at which the maximum current $I_{CRIT}$ reaches 0 is denoted as $S_{CRIT}$ and a process of specifying the value is performed (S10).

Then, a natural vector and a most probable vector are obtained and then a hybrid vector is obtained from the obtained vectors (S20).

If the previously obtained $S_{CRIT}$ is used as a reference point, a gradient of the maximum current $I_{CRIT}$ for threshold voltage skew can be calculated. Two (2) unit perturbation vectors are generated from such gradients: one is a natural vector and the other is a most probable vector.

As illustrated in FIG. 2, the natural vector indicates that threshold voltages of all the transistor elements are skewed by the same numbers as the respective standard deviations σ and is displayed via the line containing circle data points. Further, the most probable vector indicates that a skew of the random variable x is reduced as much as M by 1σ within the shortest distance and is displayed via the line containing square data points. Furthermore, as illustrated in FIG. 2, in a pyramid structure indicating the maximum current $I_{CRIT}$, a represents 1/G1 and b represents 1/G2, and an equation of a straight line crossing a and b can be defined as y=(a/b)x−a. Herein, if y is defined as the natural vector, an equation for the natural vector can be derived as follows.

$$\mu_{nat} = 1\sigma M / \Sigma_{i=1}^{6} G_i \qquad [\text{Equation 2}]$$

Likewise, an equation for the most probable vector can be derived as shown in the following Equation 3.

$$u_{mp,i} = G_i / 1\sigma M \qquad [\text{Equation 3}]$$

In consideration of skews of respective components included in the memory device, the threshold voltage skew is more likely to have an effect than the natural vector. Thus, the natural vector may induce a more negative result and the most probable vector may induce a more positive result. By applying this difference as a weighting, a hybrid vector can be derived. That is, the hybrid vector is the sum of the natural vector and the most probable vector. For example, the hybrid vector may be calculated by multiplying the natural vector by a weighting of 0.2 and multiplying the most probable vector by a weighting of 0.8.

As such, the threshold voltage skew for each transistor is applied to the perturbation vector, and, thus, the maximum current $I_{CRIT}$ of all the transistors can be calculated. A simulation is performed according to the threshold voltage skew, and if a write operation failure occurs, the number of perturbation vectors at the time when the write operation failure occurs is extracted and output as an access disturb margin (ADM) which becomes an index of a yield of a SRAM. Meanwhile, not only the conditions for applying a DC voltage but also the conditions for applying an AC voltage can be considered.

In the technical background described above, the yield of the SRAM can be calculated according to the following equation.

$$\text{YIELD} = \sum_{n=0}^{k} \frac{\lambda^n \exp(-\lambda)}{n!} \qquad [\text{Equation 4}]$$

Herein, k represents the maximum number of failures repairable in a memory chip and λ represents the estimated number of failures.

The above-described method for SRAM yield estimation is the conventional technology. Therefore, detailed description thereof will be omitted.

As described above, the conventional method for determining an access disturb margin and a write margin is based on premise that the maximum current $I_{CRIT}$ is subject to linear approximation. However, actually, a gradient of the maximum current is not a constant value. Therefore, it is difficult to accurately measure a yield.

Figure 3A:
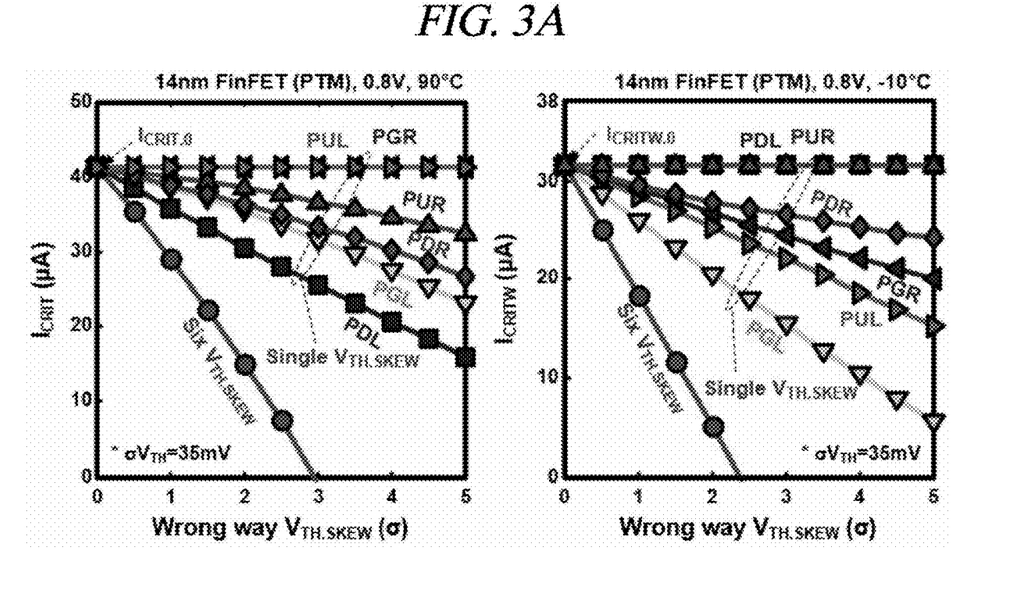
FIG. 3A and FIG. 3B illustrate the simulation results of a maximum current $I_{CRIT}$ and a minimum current $I_{CRITW}$ depending on a threshold voltage skew in a SRAM.
Figure 3B:
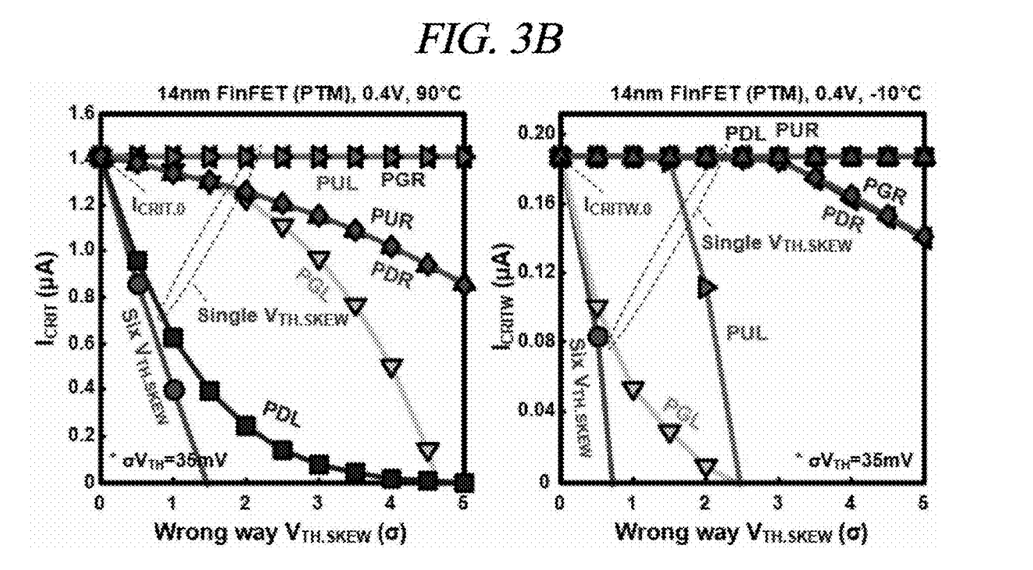

FIG. 3A and FIG. 3B illustrate the simulation results of a maximum current $I_{CRIT}$ and a minimum current $I_{CRITW}$ depending on a threshold voltage skew in a SRAM.

As illustrated in FIG. 3A, it can be seen that when a power voltage is in a high voltage (0.8 V) state, the maximum current and the minimum current maintain a linear state. However, it can be seen that when the power voltage is in a low voltage (0.4 V) state, the maximum current and the minimum current are in a non-linear state.

Figure 4:
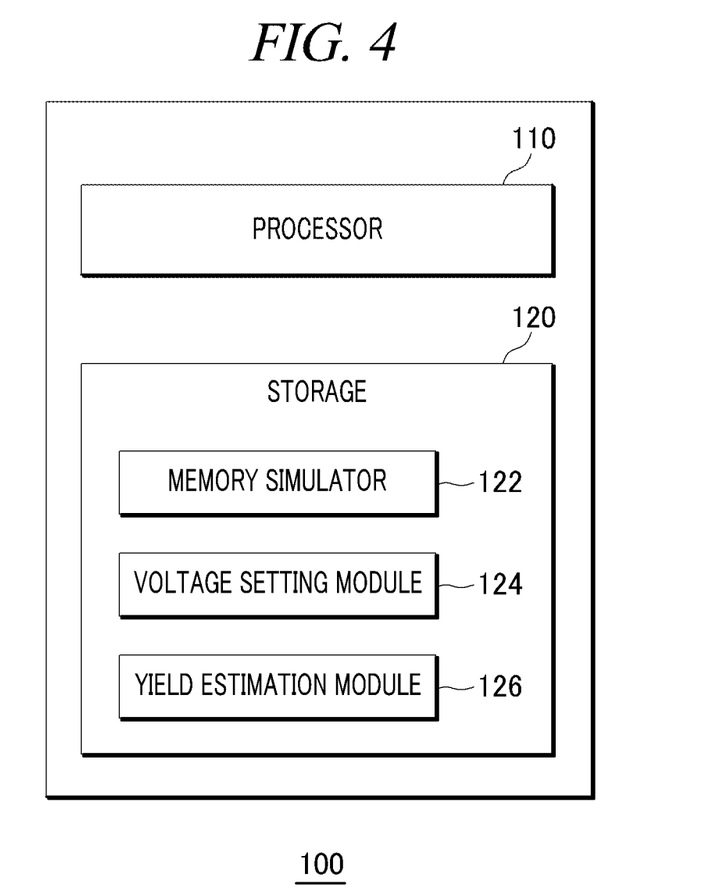
FIG. 4 is a block diagram illustrating a memory yield estimation apparatus.

FIG. 4 is a block diagram illustrating a memory yield estimation apparatus.

A memory yield estimation apparatus 100 may include a processor 110 that executes a memory yield estimation program and a storage 120 that stores the memory yield estimation program, and may be implemented as a computer or a portable device. Herein, the computer may include, for example, a notebook computer, a desktop computer, a laptop computer, etc., and the portable device ensures, for example, portability and mobility and may include all kinds of handheld-based devices such as a smart phone, a tablet PC, etc.

The processor 110 may be implemented as including at least one processing unit (CPU, micro-processor, DSP, etc.), a RAM (Random Access Memory), a ROM (Read-Only Memory), and the like, and may read the program stored in the storage 120 to the RAM and execute the program through the at least one processing unit. Meanwhile, in some exemplary embodiments, the term "processor" may be interpreted as having the same meaning as the terms "control unit", "controller" and "operation device".

Further, the storage 120 collectively refers to a non-volatile storage device that retains information stored therein even when power is not supplied and a volatile storage device that requires power to retain information stored therein. As illustrated in the drawing, the storage 120 may include a memory simulator 122 constituting a memory yield estimation program, a voltage setting module 124, and a yield estimation module 126.

The memory simulator 122 is configured to design a detailed circuit diagram of the memory and perform an operation simulation accordingly. The memory simulator 122 has the same configuration as generally known in the art. Therefore, detailed description thereof will be omitted. The memory simulator 122 enables a user to check a design plan and also modify the design plan with reference to a result of yield estimation.

The voltage setting module 124 is configured to set various kinds of voltages for design of the memory as a simulation target depending on conditions set by the user and enables operations of applying the voltages to be simulated. In the present disclosure, an assist operation and a normal operation of the SRAM are differentiated, a voltage for each operation is set, and operations of applying the voltages are simulated.

The yield estimation module 126 is configured to calculate a perturbation vector which is a major feature of the present disclosure, calculate each of an access disturb margin and a write margin depending on the perturbation vector, and calculate a yield estimate for design of the memory as a test target on the basis of the margins.

Figure 5:
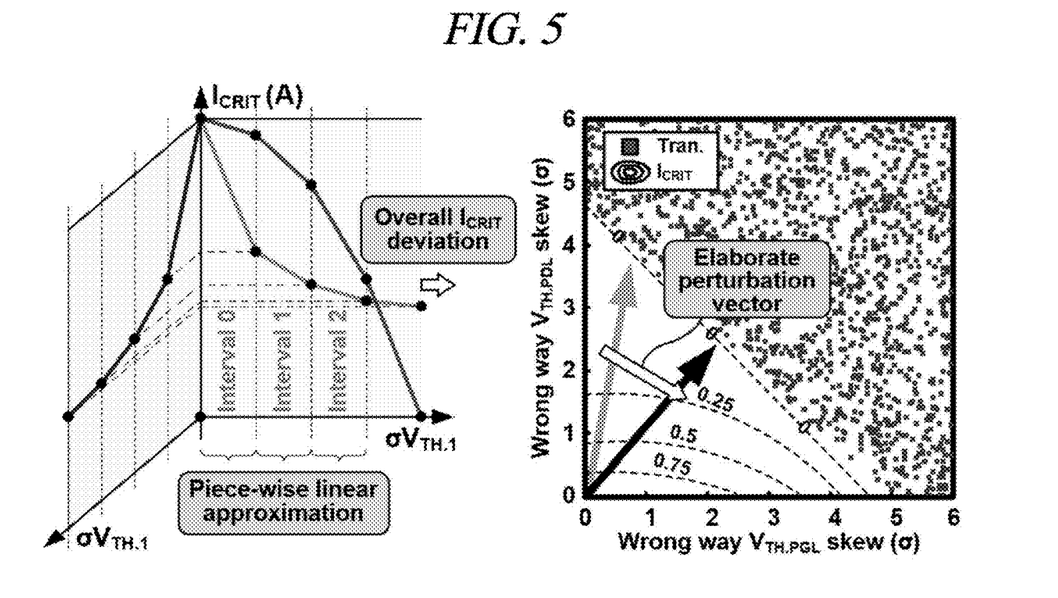
FIG. 5 is a diagram provided to explain a method for memory yield estimation.

FIG. 5 is a diagram provided to explain a method for memory yield estimation.

In the present disclosure, piecewise linear approximation substitute for the conventional linear approximation for the maximum current $I_{CRIT}$ and the minimum current $I_{CRITW}$ to minimize an error caused by non-linear characteristics of the maximum current and the minimum current in a low-voltage environment.

As shown in FIG. 4, each of the maximum current and the minimum current is divided into predetermined sections and a gradient of the maximum current or a gradient of the minimum current in each section is set as a constant value. As such, a gradient in each section is set as a constant value and a perturbation vector for each section is calculated to minimize the occurrence of an error. In this case, if k is the number of sections dividing the maximum current or minimum current, a variation of the maximum current or minimum current in each section may be changed as follows.

$$\delta M_k = \sum_{i=1}^{6} G_{k,i} \delta x_{k,i}$$ [Equation 5]

Herein, i represents the number of transistors included in a memory cell. The current design includes six (6) transistors but may be modified depending on the number of transistors included in a memory cell to which yield estimation is performed.

Equation 5 can be rearranged as follows according to the definition of a standard deviation.

$$1\sigma M = \sqrt{\frac{1}{N}\sum_{k=1}^{N} \delta M_k^2} = \sqrt{\frac{1}{N}\sum_{k=1}^{N}\sum_{i=1}^{6} G_{k,i}^2 \sigma_{k,i}^2} = \sqrt{\sum_{i=1}^{6} \hat{G}_i^2 \sigma_i^2}$$ [Equation 6]

Herein, $G_{k,i} = |\partial M_k / \partial x_{k,i}|$ represents a gradient value in a section dividing the maximum current or minimum current.

Further, a gradient value in each section can be represented as follows.

$$\hat{G}_i = \sqrt{\frac{1}{N\sigma_i^2}\sum_{k=1}^{N} G_{k,i}^2 \sigma_{k,i}^2}$$ [Equation 7]

Further, a standard deviation of a threshold voltage in each section can be calculated as follows.

$$\sigma_{k,i} = \sqrt{\int_k (x_i - \mu_i)^2 p(x_i) dx}, \text{ where } \mu_i = \int_k x_i p(x_i) dx$$ [Equation 8]

Equation 7 and Equation 8 can be transformed into a normalized equation as follows.

$$1\sigma M = \sqrt{\sum_{i=1}^{6} \hat{G}_i^2}, \text{ where } \hat{G}_i = \sqrt{\frac{1}{N}\sum_{k=1}^{N} G_{k,i}^2 \sigma_{k,i}^2}.$$ [Equation 9]

The values calculated accordingly may be applied to Equation 2 and Equation 3, respectively, and, thus, a natural vector and a most probable vector can be calculated.

Meanwhile, in a SRAM being used lately, an assist operation is performed.

A process of performing an assist operation during a read operation includes an underdrive section (WL=WLUD) in which a voltage applied to a word line is lower than that in a normal section and a normal section (WL=VDD). In this case, a bit line is in a floating state, and, thus, a voltage for the bit line is continuously changed. As a result, an actual yield of the SRAM may vary depending on voltage conditions in the assist operation. According to the conventional method, all the perturbation vectors are generated in consideration of DC voltage conditions only, and, an error unavoidably occurs. Accordingly, the present disclosure provides a new method for a process of generating a perturbation vector.

Figure 6:
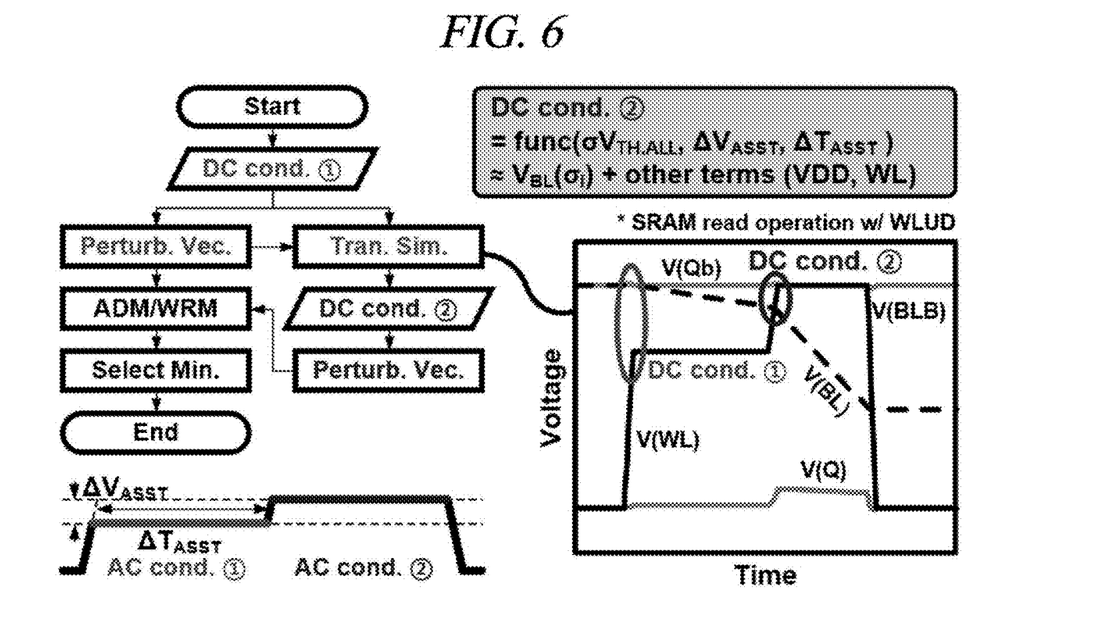
FIG. 6 is a diagram illustrating a method for generating a perturbation vector of the SRAM.
Figure 7:
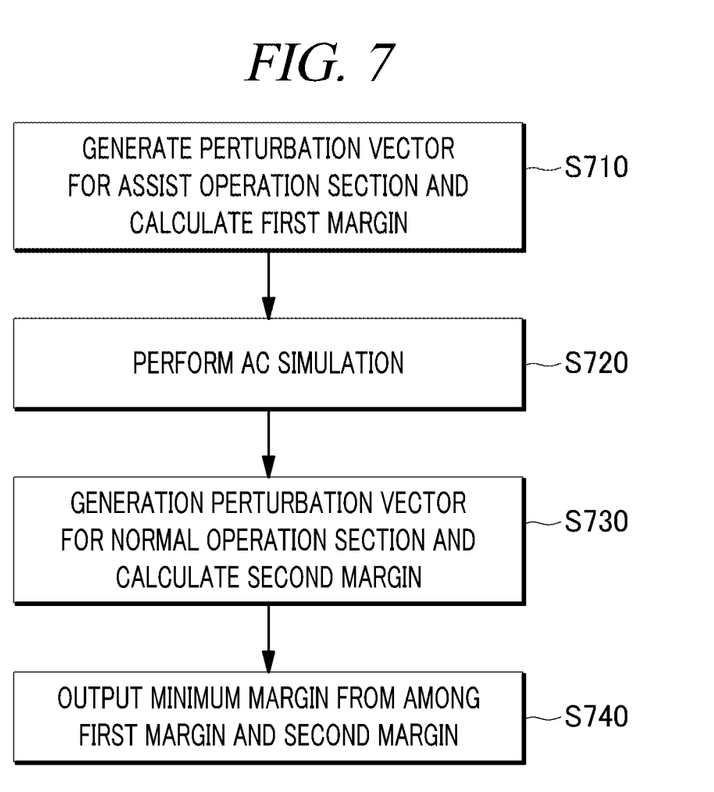
FIG. 7 is a flowchart illustrating a method for generating a perturbation vector of the SRAM.

FIG. 6 and FIG. 7 are flowcharts illustrating a method for generating a perturbation vector of the SRAM.

As illustrated in the drawings, in the SRAM, a read operation or a write operation including an assist operation section and a normal operation section is performed. A voltage applied to a word line in the assist operation section is typically set to be lower than a power voltage VDD applied in the normal operation section. In the assist operation section, a bit line voltage is floated in a state where DC voltage conditions are set. Thus, while an assist operation is performed, a voltage for a bit line is changed. The present disclosure is designed to reflect changes in perturbation vector caused by this change.

Firstly, a perturbation vector may be generated depending on a DC voltage input condition for an assist operation section, and a first margin may be calculated on the basis of the perturbation vector (S710). Herein, the DC voltage input condition refers to a power voltage or a voltage applied to a word line. Further, the first margin is calculated on the basis of a perturbation vector generated according to the above-described piecewise-linear approximation and includes an access disturb margin or a write margin. Herein, the first margin is a margin calculated on the basis of the DC voltage input condition for the assist operation section and defined separately to be differentiated from a second margin which will described later.

Then, an AC simulation is performed during the assist operation section previously determined depending on the DC voltage input condition set in the previous process S710 (S720). As the AC simulation is performed, a bit line voltage can be determined at the time when the assist operation is ended, and then, the bit line voltage may be used as a DC voltage input condition for a normal operation section.

Then, a perturbation vector is generated depending on DC voltage input conditions for the normal operation section which include the bit line voltage value determined when the AC simulation performed in the previous process S720 is ended, and the second margin is calculated on the basis of the perturbation vector (S730). The second margin is calculated on the basis of a perturbation vector generated according to the above-described piecewise-linear approximation and includes an access disturb margin or a write margin. Herein, the second margin is a margin calculated on the basis of the DC voltage input conditions for the normal operation section and defined separately to be differentiated from the above-described first margin.

Then, the calculated first margin and second margin are compared in value and a minimum margin having the lowest value is selected (S740). A yield of the SRAM is estimated on the basis of the minimum access disturb margin or minimum write margin calculated as such.

The method for memory yield estimation can be embodied in a storage medium including instruction codes executable by a computer such as a program module executed by the computer. Besides, the data structure can be stored in the storage medium executable by the computer. A computer-readable medium can be any usable medium which can be accessed by the computer and includes all volatile/non-volatile and removable/non-removable media. Further, the computer-readable medium may include a computer storage medium. The computer storage medium includes all volatile/non-volatile and removable/non-removable media embodied by a certain method or technology for storing information such as computer-readable instruction code, a data structure, a program module or other data.

The system and method of the present disclosure have been explained in relation to a specific scenario, but its components or a part or all of its operations can be embodied by using a computer system having general-purpose hardware architecture.

The above description of the present disclosure is provided for the purpose of illustration, and it would be understood by those skilled in the art that various changes and modifications may be made without changing technical conception and essential features of the present disclosure. Thus, it is clear that the above-described embodiments are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

We claim:

1. A method for SRAM (Static Random-Access Memory) yield estimation, comprising:
   generating a first perturbation vector depending on a DC (Direct Current) voltage input condition for an assist operation mode of a SRAM which is an estimation target;
   calculating a first margin on the basis of the first perturbation vector;
   performing an AC (Alternating Current) simulation during the assist operation mode depending on the DC voltage input condition;
   generating a second perturbation vector depending on a DC voltage input condition for a normal operation mode which is set when the AC simulation is ended;
   calculating a second margin on the basis of the second perturbation vector; and
   selecting a minimum margin from among the first margin and the second margin and estimating a yield of the SRAM on the basis of the selected margin;
   wherein the generating of a first perturbation vector or the generating of a second perturbation vector includes dividing a maximum current or minimum current derived on the basis of N-curve metric into predetermined sections according to piecewise-linear approximation and calculating a perturbation vector for the each predetermined section.

2. The method for SRAM yield estimation of claim 1, wherein each of the first margin or the second margin includes an access disturb margin and a write margin.

3. The method for SRAM yield estimation of claim 1, wherein the generating of a first perturbation vector or the generating of a second perturbation vector includes:
   calculating a natural vector and a most probable vector for the each predetermined section; and
   calculating a hybrid vector obtained by summing up the natural vector and the most probable vector using a predetermined weighting as the first perturbation vector or the second perturbation vector.

4. A method for SRAM (Static Random-Access Memory) yield estimation, comprising:

dividing a maximum current or minimum current derived on the basis of N-curve metric into predetermined sections according to piecewise-linear approximation;

calculating a perturbation vector for the each predetermined section;

calculating an access disturb margin or write margin on the basis of the perturbation vector; and estimating a yield of the SRAM on the basis of the access disturb margin or write margin;

wherein the maximum current or minimum current is output under a DC(Direct Current) voltage input condition for the SRAM which is an estimation target.

5. The method for SRAM yield estimation of claim 4, wherein the calculating a perturbation vector includes:

calculating a natural vector and a most probable vector for the each predetermined section; and calculating a hybrid vector obtained by summing up the natural vector and the most probable vector using a predetermined weighting as the perturbation vector.

* * * * *